(12) United States Patent
Tsunashima

(10) Patent No.: US 11,281,151 B2
(45) Date of Patent: Mar. 22, 2022

(54) IMAGE FORMING APPARATUS HAVING COVER

(71) Applicant: BROTHER KOGYO KABUSHIKI KAISHA, Nagoya (JP)

(72) Inventor: Ryunosuke Tsunashima, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

(21) Appl. No.: 17/208,382

(22) Filed: Mar. 22, 2021

(65) Prior Publication Data

US 2021/0302907 A1    Sep. 30, 2021

(30) Foreign Application Priority Data

Mar. 31, 2020 (JP) .............................. JP2020-063249

(51) Int. Cl.
| | |
|---|---|
| G03G 21/00 | (2006.01) |
| B41J 29/00 | (2006.01) |
| H05K 5/00 | (2006.01) |
| G03G 21/16 | (2006.01) |
| B41J 29/13 | (2006.01) |
| H05K 5/03 | (2006.01) |

(52) U.S. Cl.
CPC .......... *G03G 21/1633* (2013.01); *B41J 29/13* (2013.01); *H05K 5/03* (2013.01)

(58) Field of Classification Search
CPC ......... G03G 21/1633; G03G 2221/169; G03G 2221/16; G03G 2221/1654; B41J 29/13; H02B 1/38; H02G 3/081; H02G 3/14; H05K 5/0013; H05K 5/0239; H05K 5/03

USPC ......... 399/107; 347/108, 152, 263; 361/616; 174/563
See application file for complete search history.

(56) References Cited

U.S. PATENT DOCUMENTS

| | | | |
|---|---|---|---|
| 10,252,553 B2 * | 4/2019 | Takabatake | .............. B41J 29/13 |
| 2018/0164858 A1 * | 6/2018 | Lee | ........................ H05K 5/04 |
| 2019/0077174 A1 * | 3/2019 | Tamai | .................. B41J 2/17509 |
| 2019/0302677 A1 * | 10/2019 | Inoue | ................. G03G 21/1633 |

FOREIGN PATENT DOCUMENTS

| | | | | |
|---|---|---|---|---|
| JP | 2001-225527 A | | 8/2001 | |
| JP | 2006-096011 A | | 4/2006 | |
| JP | 2006-178338 A | | 7/2006 | |
| JP | 2020095138 A | * | 6/2020 | ......... G03G 21/1633 |

* cited by examiner

*Primary Examiner* — Robert B Beatty

(74) *Attorney, Agent, or Firm* — Merchant & Gould P.C.

(57) ABSTRACT

An image forming apparatus includes a main body and a cover including a first surface part and a second surface part. The cover includes a first protrusion formed on the first surface part and extending in a first direction and a second protrusion formed on the second surface part and extending in a second direction perpendicular to the first direction. The main body includes an engaging portion engaged with the first protrusion and a groove portion formed along the side surface part and having an opening that opens the front surface part so that the second protrusion is capable of being inserted into and extracted from the main body in the first direction. The groove portion has a portion inclined in a manner that the groove portion is located at a further upper side in a vertical direction as the groove portion becomes closer to the front surface part.

9 Claims, 6 Drawing Sheets

IMAGE FORMING APPARATUS HAVING COVER

CROSS-REFERENCE TO RELATED APPLICATIONS

This application is based upon and claims the benefit of priority from prior Japanese patent application No. 2020-063249, filed on Mar. 31, 2020, the entire contents of which are incorporated herein by reference.

TECHNICAL FIELD

Aspects of the present disclosure relates to an image forming apparatus having a cover attached to a main body.

BACKGROUND ART

In an image forming apparatus such as a printer and a complex machine, an openable and closable cover is attached to an apparatus main body. Related art discloses an image forming apparatus including a main body casing having an opening provided on one side surface, a cover capable of opening and closing the opening of the main body casing, and a lock means for keeping the cover in a closed state with respect to the main body casing. The lock means is configured by a claw portion provided to the cover and an engaged portion that can engage with the claw portion. When opening the cover, the cover is pulled forward, so that an engaged state between the claw portion and the engaged portion is released.

The cover of the apparatus disclosed in the related-art is frequently opened and closed when attaching and detaching a cartridge, a sheet feeding cassette and the like. For this reason, the engaged state between the claw portion and the engaged portion can be easily released. In the meantime, other than the cover disclosed in the related-art, there is a cover that is not opened and closed during usual use but is detached only during maintenance of the apparatus or product inspection. This cover may be firmly fixed to the apparatus main body so as not to be separated from the apparatus main body during usual use.

In order to firmly fix the cover for maintenance and the apparatus main body to each other, engaging strength between the claw portion and the engaged portion may be increased. In this case, however, when detaching the cover from the apparatus main body during maintenance, a large force is applied to the claw portion and the engaged portion, so that members such as the claw portion and the engaged portion may be damaged.

SUMMARY

An aspect of the present disclosure provides an image forming apparatus in which a main body and a cover are firmly fixed to each other and a member is difficult to be damaged when detaching the cover from the main body.

According to an aspect of the present disclosure, there is provided an image forming apparatus including: a main body including a front surface part and a side surface part connected to the front surface part; and a cover including a first surface part disposed to face the front surface part and a second surface part connected to the first surface part and disposed to face the side surface part, the cover being attachable to and detachable from the main body, wherein the cover includes: a first protrusion formed on the first surface part and extending toward the front surface part in a first direction perpendicular to the first surface part; and a second protrusion formed on the second surface part and extending toward the side surface part in a second direction perpendicular to the first direction, wherein the main body includes: an engaging portion formed on the front surface part and engaged with the first protrusion and a groove portion formed along the side surface part, wherein the groove portion has an opening that opens the front surface part so that the second protrusion is capable of being inserted into and extracted from the main body in the first direction, and wherein the groove portion has a portion which is inclined in a manner that the groove portion is located at a further upper side in a vertical direction as the groove portion becomes closer to the front surface part, the vertical direction being perpendicular to both the first direction and the second direction.

DESCRIPTION OF EMBODIMENTS

Figure 1:
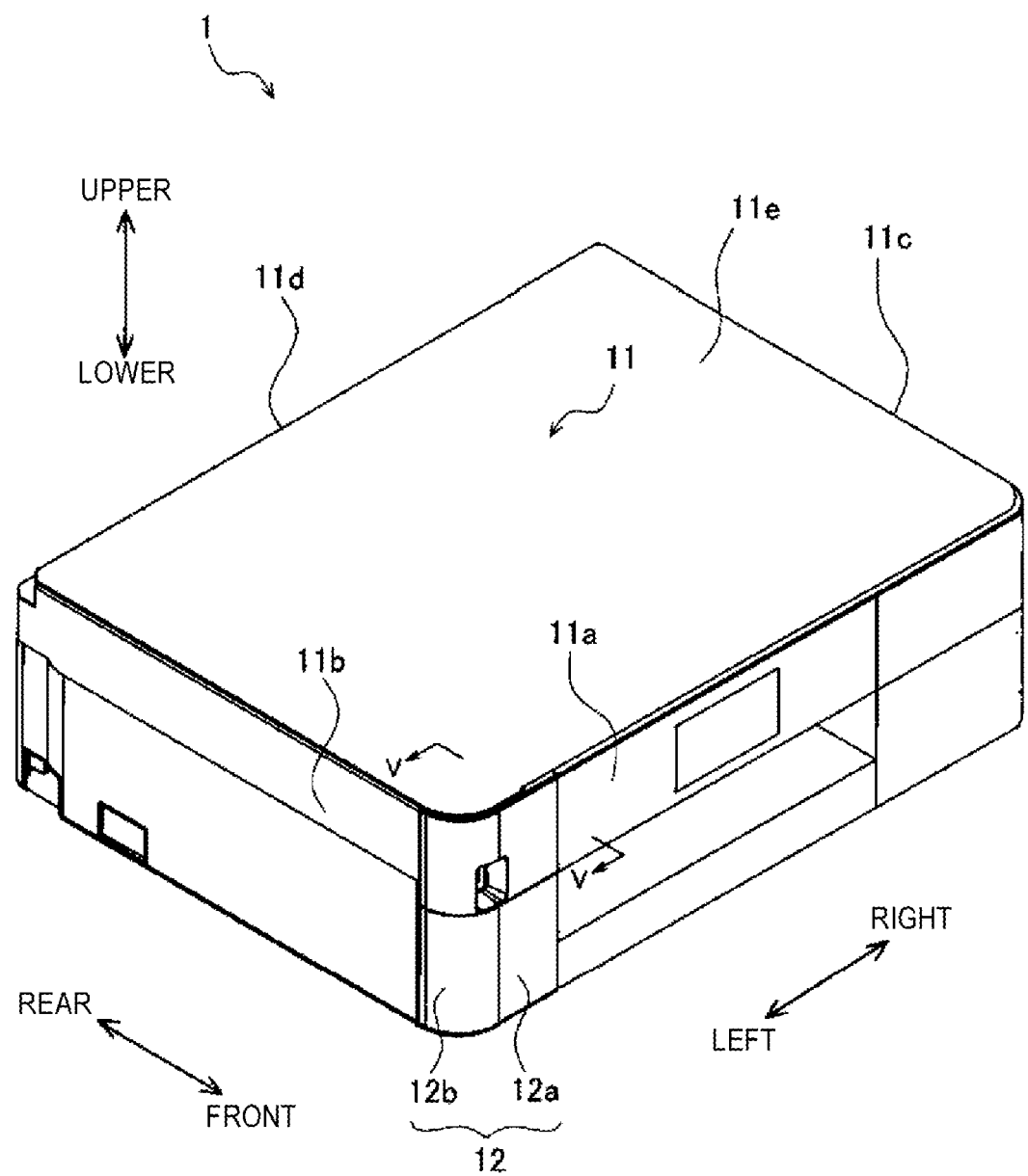
FIG. 1 is a schematic perspective view depicting an outer shape of a printer in accordance with an embodiment of the present disclosure.

Hereinbelow, a printer 1 (the image forming apparatus of the present disclosure) in accordance with a preferable embodiment of the present disclosure will be described with reference to FIGS. 1 to 4. Note that, the upper and lower direction, the right and left direction and the front and rear direction shown in FIG. 1 are referred to as the upper and lower direction, the right and left direction and the front and rear direction of the printer 1. The upper and lower direction can also be referred to as the vertical direction.

(Overall Configuration of Printer 1)

As shown in FIG. 1, the printer 1 includes a main body 11, and a cover 12 attachable to and detachable from the main body 11. The main body 11 has a front surface part 11a, a left side surface part 11b, a right side surface part 11c, a rear surface part 11d and a top surface part 11e. Corners at which the front surface part 11a and the left side surface part 11b and the front surface part 11a and the right side surface part 11c of the main body 11 are connected to each other each have a so-called corner R shape, which is a shape curved along a curve line as viewed from above. As described later, the top surface part 11e can be detached upward.

Figure 2:
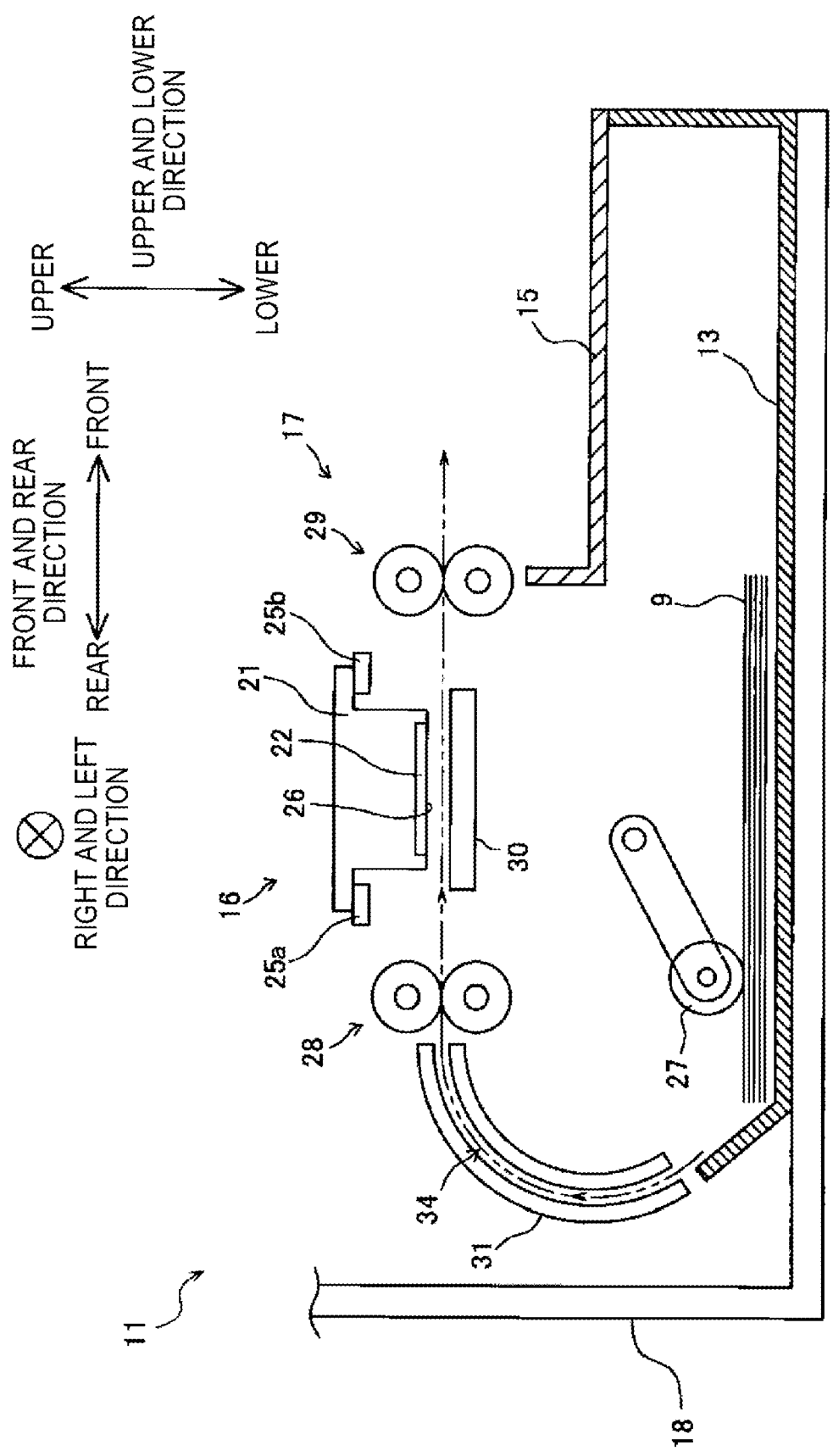
FIG. 2 is a schematic side view depicting an internal structure of the printer in accordance with the embodiment of the present disclosure.

As shown in FIG. 2, the main body 11 includes a sheet feeding unit 13 in which sheets 9 are accommodated, a sheet discharge unit 15, a recording unit 16 configured to form an image on the sheet 9, a conveyor unit 17, and a housing 18. The housing 18 includes the front surface part 11a, the left side surface part 11b, the right side surface part 11c, the rear surface part 11d, the top surface part 11e, a bottom surface part (not shown), and the cover 12. The sheet feeding unit 13, the recording unit 16 and the conveyor unit 17 are accommodated in the housing 18 of the main body 11. In the housing 18, the sheet feeding unit 13 is disposed below the recording unit 16.

The sheet feeding unit 13 can support and accommodate a plurality of stacked sheets 9. The sheet feeding unit 13 is capable of being inserted into and extracted from the housing 18 the front and rear direction.

The sheet discharge unit 15 is configured to accommodate thereon the sheet 9 on which an image is recorded by a recording head 22 (which will be described later) of the recording unit 16. The sheet discharge unit 15 is disposed above a front side of the sheet feeding unit 13, and is configured to move as the sheet feeding unit 13 is inserted into and extracted from the housing 18.

The recording unit 16 includes a carriage 21 and a recording head 22. As shown in FIG. 2, the carriage 21 is supported by two guide rails 25a and 25b. The two guide rails 25a and 25b are disposed apart from each other in the front and rear direction, and each extend in the right and left direction. The carriage 21 is disposed over the two guide rails 25a and 25b. The carriage 21 is driven to reciprocally move in the right and left direction along the two guide rails 25a and 25b by a carriage motor (not shown).

The recording head 22 is mounted on the carriage 21, and is configured to reciprocally move in the right and left direction together with the carriage 21. In a nozzle surface 26 of a lower surface of the recording head 22, a plurality of nozzles (not shown) for ejecting inks is disposed in a conveying direction (the front and rear direction) perpendicular to the right and left direction. Also, the nozzles are aligned in four rows in the right and left direction in the nozzle surface 26, and are configured to record an image on the sheet 9 by ejecting inks, which are supplied from four ink cartridges (not shown) in which four colors of inks (black, cyan, magenta and yellow) are stored, from each of the nozzle rows. That is, the printer 1 of the present embodiment is an inkjet-type serial printer that can print a color image.

The conveyor unit 17 is for conveying the sheet 9 inside of the printer 1, and includes a feeder roller 27, a pair of conveyor rollers 28, a pair of discharge rollers 29, a platen 30, and a guide member 31. The feeder roller 27 is disposed above the sheet feeding unit 13 and is configured to rotate as a drive force is applied thereto from a feeder motor (not shown), thereby delivering the sheet 9 accommodated in the sheet feeding unit 13 toward the rear. The pair of conveyor rollers 28 and the pair of discharge rollers 29 are disposed with the recording unit 16 being sandwiched therebetween in the front and rear direction, the pair of conveyor rollers 28 is disposed at the rear side of the recording unit 16, and the pair of discharge rollers 29 is disposed in front of the recording unit 16. The pair of conveyor rollers 28 is configured to send the sheet 9 to a region facing the nozzle surface 26 of the recording head 22. The pair of discharge rollers 29 is configured to receive the sheet 9 sent by the pair of conveyor rollers 28, and to discharge the sheet 9 to the sheet discharge unit 15. The pair of conveyor rollers 28 and the pair of discharge rollers 29 are rotatively driven by a conveyor motor (not shown).

The platen 30 is disposed to face the nozzle surface 26 of the recording unit 16 below the recording unit 16. The guide member 31 defines a conveying path 34 along which the sheet 9 sent from the sheet feeding unit 13 by the feeder roller 27 is sent to the region facing the nozzle surface 26 of the recording head 22. The guide member 31 extends from a vicinity of a rear end portion of the sheet feeding unit 13 to a vicinity of the pair of conveyor rollers 28.

The sheet 9 delivered to the rear side from the sheet feeding unit 13 by the feeder roller 27 passes through the conveying path 34 defined by the guide member 31, and reaches a position in which the sheet is sandwiched by the pair of conveyor rollers 28. The sheet 9 sandwiched by the pair of conveyor rollers 28 is conveyed to the region facing the nozzle surface 26 of the recording head 22 by rotation of the pair of conveyor rollers 28. The inks are ejected from the nozzles provided in the nozzle surface 26 of the recording head 22 moving in the right and left direction to the sheet 9 conveyed by the pair of conveyor rollers 28 in a state where the sheet is supported by the platen 30, so that an image is recorded on the sheet. The sheet 9 having an image recorded thereon is conveyed forward and is discharged to the sheet discharge unit 15 by the pair of discharge rollers 29.

Figure 3:
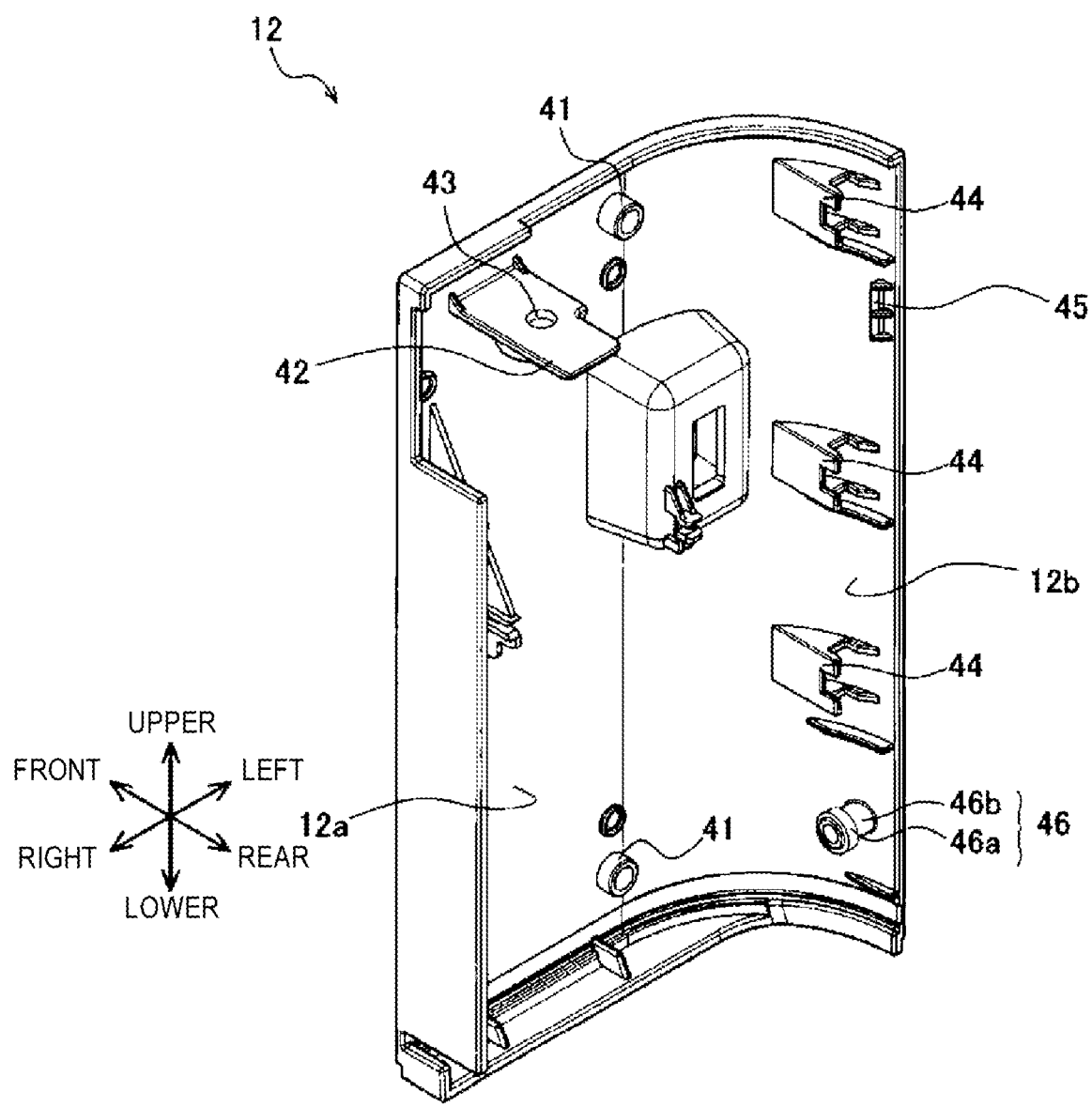
FIG. 3 is a perspective view depicting an inner structure of a cover.

The cover 12 is a member that can be attached to the main body 11 while covering a left part of the front surface part 11a of the main body 11 and a front part of the left side surface part 11b of the main body 11. As shown in FIGS. 1 and 3, the cover 12 includes a first surface part 12a disposed to face the front surface part 11a and a second surface part 12b connected to the first surface part 12a and disposed to face the left side surface part 11b when attached to the main body 11. The second surface part 12b has a portion formed along a curve, as viewed from above (refer to FIG. 3), so as to be disposed to face both a portion of the left side surface part 11b extending in the front and rear direction and the corner R-shaped portion.

As shown in FIG. 3, an upper portion and a lower portion of the first surface part 12a are each provided with positioning pins 41 (the first protrusion of the present disclosure) for defining an attaching position of the cover 12 to the front surface part 11a. The two positioning pins 41 extend from an inner surface of the first surface part 12a toward the rear side in the front and rear direction, i.e., toward the front surface part 11a in the front and rear direction. Also, an upper portion of the first surface part 12a is provided with a protrusion plate 42 (the first protrusion of the present disclosure) extending from the inner surface of the first surface part 12a toward the rear side in the front and rear direction. The protrusion plate 42 has a screw through-hole 43 penetrating in the upper and lower direction. In the screw through-hole 43, a screw can be inserted.

An end portion on the rear side of the second surface part 12b in the front and rear direction is formed with three positioning portions 44 for defining an attaching position of the cover 12 to the left side surface part 11b. Also, a claw portion 45 for fixing the cover 12 to the main body 11 is formed in a position of an upper portion of the second surface part 12b in the vicinity of the end portion on the rear side in the front and rear direction.

A fixing protrusion 46 (the second protrusion of the present disclosure) for fixing the cover 12 to the main body 11 is formed in a position of a lower portion of the second surface part 12b in the vicinity of the end portion of the second surface part 12b on the rear side in the front and rear direction. The fixing protrusion 46 extends from an inner surface of the second surface part 12b toward the right side in the right and left direction, i.e., toward the left side surface part 11b in the right and left direction. The fixing protrusion 46 has a circular column shape, and a size of a diameter of a tip end portion 46a of the fixing protrusion 46 is larger than that of a base end portion 46b.

Figure 4:
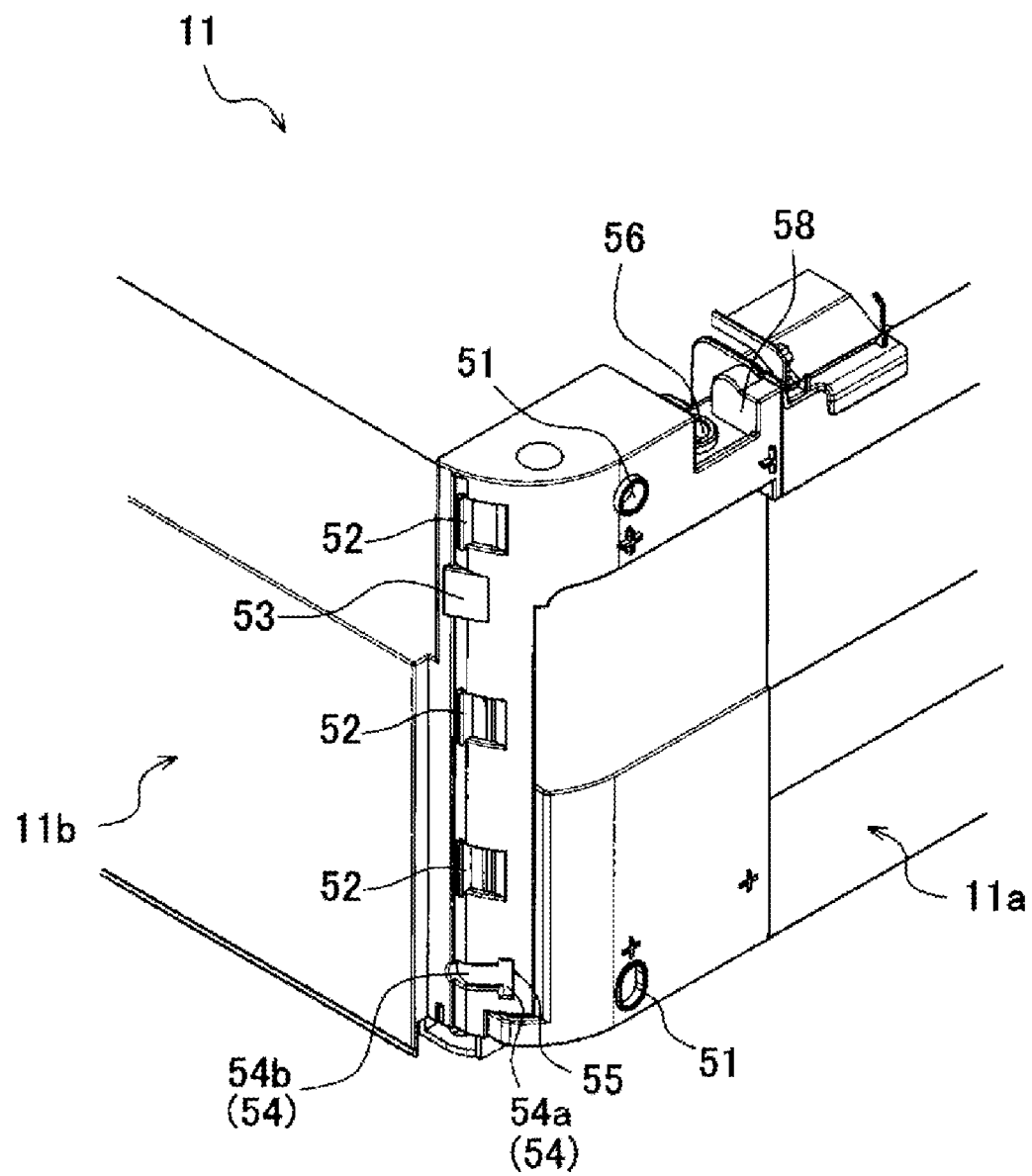
FIG. 4 is a perspective view depicting a front surface part and a left side surface part of a main body.

As shown in FIG. 4, a left upper portion and a left lower portion of the front surface part 11a of the main body 11 are formed with two front surface engaging portions 51 (the engaging portion of the present disclosure) that engages with the two positioning pins 41. Note that, in FIG. 4, the top surface part 11e is not shown for descriptions. By engaging the two positioning pins 41 and the two front surface engaging portions 51 with each other, an attaching position of the cover 12 to the front surface part 11a is defined. Also, an upper portion of the front surface part 11a of the main body 11 is formed with an upper groove 58 opened forward and upward. A bottom surface of the upper groove 58 is formed with a screw fixing concave portion 56 that is opened upward and a screw can be inserted therein.

The left side surface part 11b is formed with three side surface engaging portions 52 that engages with the three positioning portions 44. By engaging the three positioning portions 44 and the three side surface engaging portions 52 with each other, an attaching position of the cover 12 to the left side surface part 11b is defined. In addition, the side surface engaging portions 52 prevent the cover 12 from coming off leftward in the right and left direction in a state where the cover 12 is attached to the main body 11. The left side surface part 11b is also formed with an engaged portion 53 that can be engaged with the claw portion 45.

The main body 11 further includes a groove portion 54 formed along the left side surface part 11b. The groove portion 54 has an opening 55 that opens closer to the front surface part 11a so that the fixing protrusion 46 is capable of being inserted into and extracted from the main body 11 in the front and rear direction, and is inclined in a manner that that the groove portion 54 is located at a further upward side as the groove portion 54 becomes closer to the front surface part 11a (refer to FIGS. 4 and 5). A length of the groove portion 54 in the right and left direction is slightly larger than a length of the fixing protrusion 46 in the right and left direction. Also, when viewed from the opening 55 in the front and rear direction, the groove portion 54 has a first groove portion 54a formed on the right side in the right and left direction and a second groove portion 54b formed on the left side (the second surface part 12b side) in the right and left direction). The tip end portion 46a of the fixing protrusion 46 is capable of being inserted into and extracted from the first groove portion 54a, and only the base end portion 46b of the fixing protrusion 46 is capable of being inserted into and extracted from the second groove portion 54b. That is, a width of the first groove portion 54a is substantially the same as the diameter of the tip end portion 46a of the fixing protrusion 46, and a width of the second groove portion 54b is substantially the same as the diameter of the base end portion 46b of the fixing protrusion 46. A range of the first groove portion 54a in the right and left direction based on a left end of the groove portion 54 includes a range of the tip end portion 46a of the fixing protrusion 46 in the right and left direction based on the second surface part 12b of the cover 12.

The left side surface part 11b of the main body 11 includes a convex portion 57 which is located in the vicinity of the position of the base end portion 46b of the fixing protrusion 46 inserted in the second groove portion 54b in a state where the cover 12 is attached to the main body 11. The convex portion 57 narrows the width of the second groove portion 54b. In the present embodiment, the convex portion 57 extends from the lower toward the upper at the portion of the left side surface part 11b at which the second groove portion 54b is formed. Note that, as described later, the fixing protrusion 46 is required to move further rearward in the front and rear direction beyond the portion of the groove portion 54 whose width is narrowed by the convex portion 57. For this reason, the convex portion 57 is preferably a resin member having flexibility to some extent. Thereby, when the fixing protrusion 46 and the convex portion 57 come into contact with each other, a force is applied rearward in the front and rear direction to elastically deform the convex portion 57, so that the fixing protrusion 46 can be caused to move beyond the portion at which the convex portion 57 is formed. Note that, the convex portion 57 may be formed integrally with the left side surface part 11b of the main body 11, or may not be formed integrally with the left side surface part 11b of the main body 11.

(Attaching Operation of Cover 12)

Figure 5:
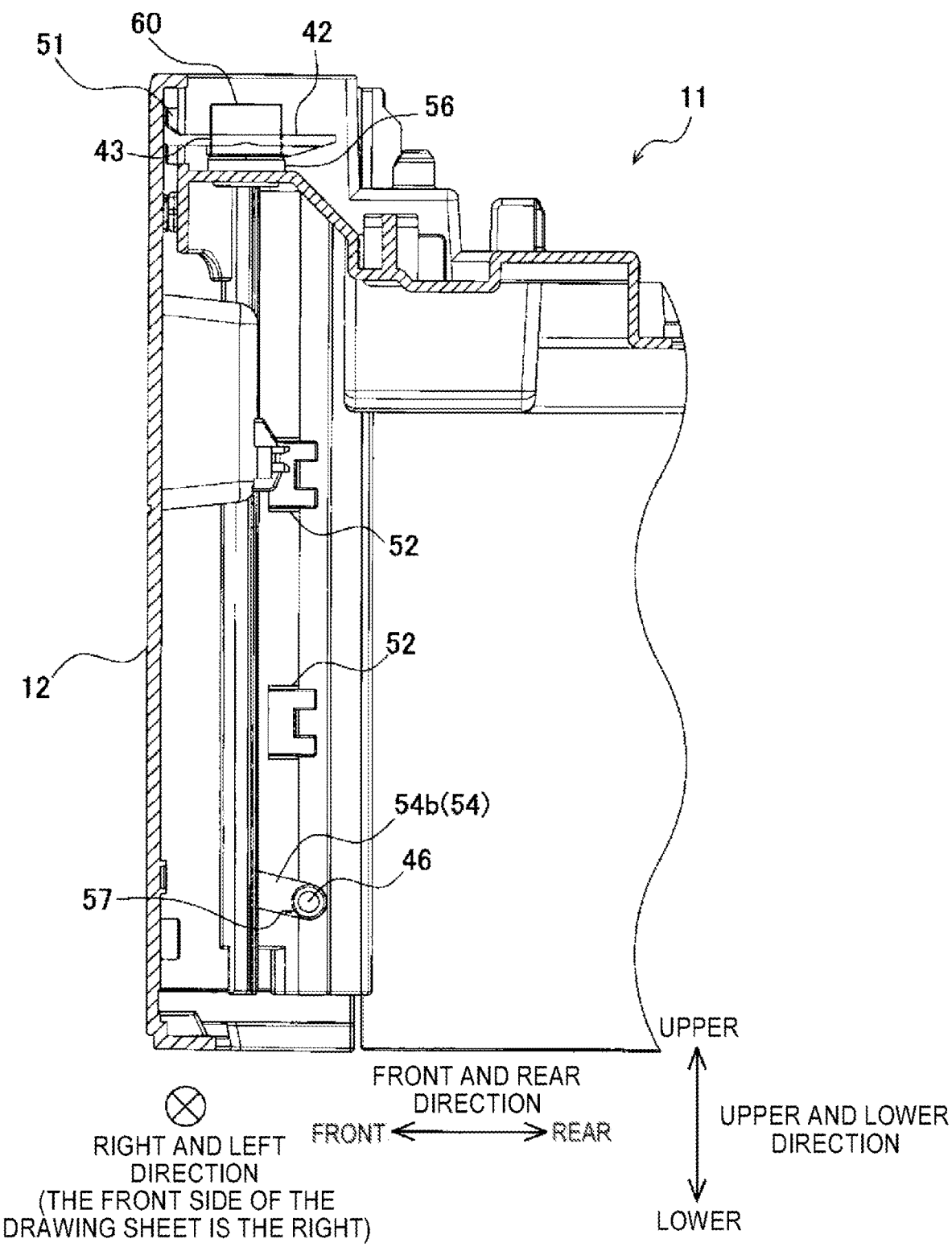
FIG. 5 is a sectional view taken along a line V-V of FIG. 1.

Subsequently, an attaching operation of the cover 12 to the main body 11 is described with reference to FIG. 5. FIG. 5 is a sectional view taken along a line V-V of FIG. 1 in a state where the top surface part 11e is detached. First, the cover 12 is moved close to the main body 11 in the front and rear direction from the front surface of the front surface part 11a of the main body 11. At this time, the cover 12 is moved close to the main body 11 while matching the positions of the positioning pins 41 and the protrusion plate 42 in the right and left direction and the positions of the front surface engaging portions 51 and the upper groove 58 in the right and left direction each other. Then, the fixing protrusion 46 of the cover 12 is inserted into the groove portion 54 from the opening 55. At this time, the tip end portion 46a of the fixing protrusion 46 is inserted into the first groove portion 54a, and the base end portion 46b of the fixing protrusion 46 is inserted into the second groove portion 54b.

Continuously, while moving the fixing protrusion 46 along the inclination of the groove portion 54, the cover 12 is moved further rearward in the front and rear direction. Then, when the base end portion 46b of the fixing protrusion 46 moves beyond the portion of the second groove portion 54b where the convex portion 57 is formed, an outer peripheral surface of the fixing protrusion 46 and a wall part of the left side surface 11b forming a rear end portion of the groove portion 54 come into contact with each other as shown in FIG. 5, so that the movement of the cover 12 in the front and rear direction is stopped. At this time, as viewed from the front, the fixing protrusion 46 is entirely positioned in the groove portion 54, and the second surface part 12b of the cover 12 and the main body 11 are located with only a small space between each other. Also, at this time, the claw portion 45 is engaged with the engaged portion 53. Note that, a correct attaching position of the cover 12 to the main body 11 is defined by engaging the positioning pins 41 and the front surface engaging portions 51 to each other and engaging the positioning portions 44 and the side surface engaging portions 52 to each other.

Finally, a screw (the fixing member of the present disclosure) is caused to pass through the screw through-hole 43 of the cover 12, and is then inserted into the screw fixing concave portion 56 of the main body 11. Thereby, the attaching operation of the cover 12 to the main body 11 is completed. That is, in the present embodiment, the screw 60 which has passed through the screw through-hole 43 of the cover 12 attached to the main body 11 is inserted in the screw fixing concave portion 56.

Note that, when detaching the cover 12 from the main body 11, the attaching operation is performed in a reverse order. That is, after detaching the screw 60, the cover 12 is moved forward in the front and rear direction along the inclination of the groove portion 54, so that the cover 12 is detached from the main body 11.

The printer 1 of the present embodiment includes the cover 12 including the first surface part 12a disposed to face the front surface part 11a and the second surface part 12b disposed to face the left side surface part 11b. The cover 12 is attachable to and detachable from the main body 11. The cover 12 includes the fixing protrusion 46 extending from the second surface part 12b toward the left side surface part 11b in the right and left direction. The main body 11 includes the groove portion 54 formed on the left side surface part 11b. The groove portion 54 has the opening 55 that opens the front surface part 11a in a manner that the fixing protrusion 46 is capable of being inserted into and extracted from the main body 11 in the front and rear direction. The groove portion 54 is inclined in a manner that the groove portion 54 is located at a further upward side as the groove portion 54 becomes closer to the front surface part 11a. According to the present embodiment, it is possible to easily detach the cover 12 from the main body 11 by moving the cover 12 away from the front surface part 11a in the front and rear direction while moving the fixing protrusion 46 along the upwardly inclined groove portion. For this reason, when detaching the cover 12 from the main body 11, it is possible to prevent an excessive force from being applied to the cover 12, so that a member thereof becomes difficult to be damaged. Also, in the state where the cover 12 is attached to the main body 11, the movement of the fixing protrusion 46 away from the front surface part 11a in the front and rear direction is regulated by the upwardly inclined groove portion 54. For this reason, in the state where the cover 12 is attached to the main body 11, the main body 11 and the cover 12 can be firmly fixed to each other.

In the present embodiment, the length of the groove portion 54 in the right and left direction is slightly larger than the length of the fixing protrusion 46 in the right and left direction. According to the present embodiment, during the attachment and detachment of the main body 11 and the cover 12, when moving the cover 12 from the front surface of the front surface part 11a of the main body 11 in the front and rear direction, the fixing protrusion 46 is not caught at a portion of the main body 11 adjacent to the right side of the opening 55 of the groove portion 54. For this reason, the main body 11 and the cover 12 can be smoothly attached and detached, so that a member thereof is more difficult to be damaged.

In the present embodiment, when viewed from the opening 55 in the front and rear direction, the tip end portion 46a of the fixing protrusion 46 in the right and left direction has a diameter larger than the base end portion 46b, and the groove portion 54 has the first groove portion 54a formed on the right side in the right and left direction and the second groove portion 54b formed on the left side (the second surface part 12b side) in the right and left direction. The tip end portion 46a is capable of being inserted into and extracted from the first groove portion 54a. Only the base end portion 46 is capable of being inserted into and extracted from the second groove portion 54b. According to the present embodiment, in the state where the cover 12 is attached to the main body 11, the tip end portion 46a of the fixing protrusion 46 is caught at the portions of the main body 11 adjacent to the top and bottom of the second groove portion 54b, so that the cover 12 is regulated from moving in the right and left direction. Thereby, in the state where the cover 12 is attached to the main body 11, the main body 11 and the cover 12 can be further firmly fixed to each other.

In the present embodiment, the left side surface part 11b of the main body 11 includes the convex portion 57 which is located in the vicinity of the position of the fixing protrusion 46 inserted in the second groove portion 54b in the state where the cover 12 is attached to the main body 11. The convex portion 57 narrows the width of the second groove portion 54b.

According to the present embodiment, in the state where the cover 12 is attached to the main body 11, the movement of the fixing protrusion 46 toward the front surface part 11a in the front and rear direction is regulated by the convex portion 57. Thereby, in the state where the cover 12 is attached to the main body 11, the main body 11 and the cover 12 can be further firmly fixed to each other.

In the present embodiment, the fixing protrusion 46 has a circular column shape. According to this configuration, when the fixing protrusion 46 is inserted into and extracted from the groove portion 54, friction that is generated between an inner peripheral surface defining the groove portion 54 and the fixing protrusion 46 can be reduced. Thereby, the cover 12 can be smoothly attached and detached with respect to the main body 11, so that a member thereof is more difficult to be damaged.

In the present embodiment, the upper portion of the main body 11 has the fixing concave portion 56 opened upward, and the cover 12 has the screw through-hole 43. The screw 60 which has passed through the screw through-hole 43 of the cover 12 attached to the main body 11 is inserted in the fixing concave portion 56. According to the present embodiment, the cover 12 is fixed to the main body 11 from above by the screw 60, so that movement of the cover 12 in the upper and lower direction is regulated. For this reason, in the state where the cover 12 is attached to the main body 11, the fixing protrusion 46 is prevented from moving along the upwardly inclined groove portion 54, so that the main body 11 and the cover 12 can be further firmly fixed to each other.

Modified Embodiments

Although the preferable embodiment of the present disclosure has been described, the present disclosure is not limited thereto, and a variety of changes can be made within the scope of the claims.

Figure 6:
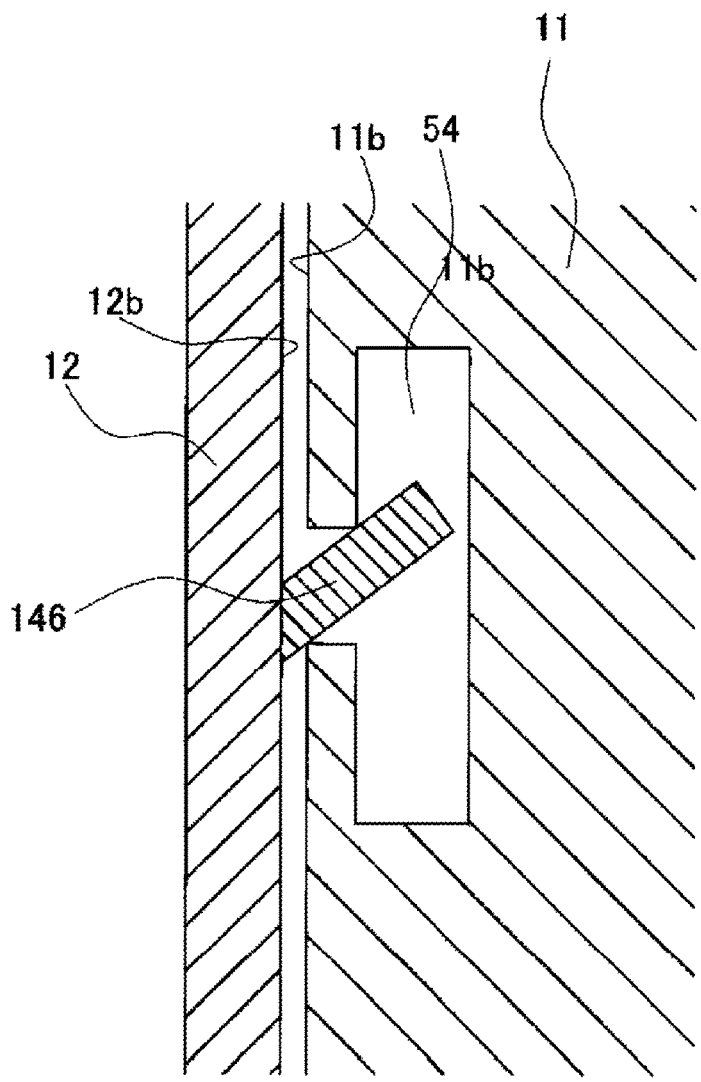
FIG. 6 is a sectional view depicting a state in which a fixing protrusion is inserted in a groove portion, in a printer in accordance with a modified embodiment.

In the above embodiment, in the state where the cover 12 is attached to the main body 11, in order to regulate the movement of the cover 12 in the right and left direction, the tip end portion 46a of the fixing protrusion 46 in the right and left direction has the larger diameter than the base end portion 46b, and the groove portion 54 has the first groove portion 54a in which the tip end portion 46a can be inserted and the second groove portion 54b in which only the base end portion 46b can be inserted. However, instead of this configuration, a fixing protrusion 146 may be inclined upward (refer to FIG. 6). FIG. 6 is a sectional view depicting that the fixing protrusion 146 is inserted in the groove portion 54 formed in the left side surface part 11b in the state where the cover 12 is attached to the main body 11. According to this configuration, in the state where the cover 12 is attached to the main body 11, the fixing protrusion 146 inclined upward in the right and left direction is caught at a portion of the main body 11 positioned on an upper side of the groove portion 54, so that the movement of the cover 12 in the right and left direction is regulated. Thereby, in the state where the cover 12 is attached to the main body 11, the main body 11 and the cover 12 can be further firmly fixed to each other. Note that, the fixing protrusion 146 may also be inclined downward. In this case, in the state where the cover 12 is attached to the main body 11, the fixing protrusion 146 inclined downward in the right and left direction is caught at a portion of the main body 11 positioned on a lower side of the groove portion 54, so that the movement of the cover 12 in the right and left direction is regulated.

In the above embodiment, the claw portion 45 is formed at the upper portion and the fixing protrusion 46 is formed at the lower portion in the positions adjacent to the end portion on the rear side of the second surface part 12*b* of the cover 12 in the front and rear direction. However, the fixing protrusion may be formed at the upper portion, and the claw portion may be formed at the lower portion. In this case, the engaged portion and the groove portion are formed in positions of the main body 11 corresponding to the claw portion and the fixing protrusion. The fixing protrusion may be formed at each of the upper and lower portions in the positions adjacent to the end portion on the rear side of the second surface part 12*b* of the cover 12 in the front and rear direction. In this case, the main body 11 is not formed with the engaged portion 53, and is formed with two groove portions in positions corresponding to the two fixing protrusions.

In the above embodiment, the groove portion 54 is inclined so that the groove portion 54 is located at the further upper side as the groove portion 54 becomes closer to the front surface part 11*a*. However, only a part of the groove portion, which is in front of the fixing protrusion in the state where the cover 12 is attached to the main body 11, may be inclined.

In the above embodiment, the fixing protrusion 46 has the circular column shape. However, the fixing protrusion may have a shape other than the circular column shape, for example, a polygonal prism shape such as a triangular prism shape and a quadrangular prism shape.

In the above embodiment, the upper portion of the first surface part 12*a* of the cover 12 is formed with the protrusion plate 42, and the protrusion plate 42 is formed with the screw through-hole 43 penetrating in the upper and lower direction. However, the upper portion of the first surface part 12*a* of the cover 12 may be formed with a protrusion plate extending toward the left side surface part 11*b* in a second direction. In this case, the protrusion plate does not correspond to the first protrusion of the present disclosure.

In the above embodiment, the screw 60 passing through the screw through-hole 43 formed in the cover 12 attached to the main body 11 and penetrating in the upper and lower direction is inserted in the fixing concave portion 56 opened upward. However, the screw through-hole may also be formed in the first surface part 12*a* of the cover 12 and penetrate in the front and rear direction. In this case, the front surface part 11*a* of the main body 11 is formed with a fixing concave portion opened forward in the front and rear direction. The screw passing through the screw through-hole penetrating in the front and rear direction of the cover 12 attached to the main body 11 is inserted in the fixing concave portion opened forward. The screw through-hole may also be formed in the second surface part 12*b* of the cover 12 and penetrate in the right and left direction. In this case, the left side surface part 11*b* of the main body 11 is formed with a fixing concave portion opened leftward in the right and left direction. The screw passing through the screw through-hole penetrating in the right and left direction of the cover 12 attached to the main body 11 is inserted in the fixing concave portion opened leftward. Also, the fixing member of the present disclosure is not limited to the screw, and may be, for example, a metal pin.

In the above embodiment, the cover 12 includes the second surface part 12*b* disposed to face the left side surface part 11*b*. However, the cover 12 may also include two second surface parts disposed to face both the left side surface part 11*b* and the right side surface part 11*c*. In this case, the first surface part of the cover 12 is configured to entirely cover the front surface part 11*a* of the main body 11 in the right and left direction.

In the above embodiment, the convex portion 57 extends from the lower side toward the upper side at the portion of the left side surface part 11*b* where the second groove portion 54*b* is formed. However, the convex portion may extend from the upper side toward the lower side. The main body 11 may include both a convex portion extending from the lower side toward the upper side and a convex portion extending from the upper side toward the lower side.

In the above embodiment, a finger hook portion for a user to hook a finger when detaching the cover 12 from the main body 11 may be formed in a position of the end portion on the rear side of the second surface part 12*b* of the cover 12 in the front and rear direction. Thereby, the cover 12 can be easily detached from the main body 11.

In the above embodiment, the corners at which the front surface part 11*a* and the left side surface part 11*b* and the front surface part 11*a* and the right side surface part 11*c* of the main body 11 are connected to each other have the corner R shape, respectively. However, the corners at which the front surface part and the left side surface part and the front surface part and the right side surface part of the main body 11 are connected to each other may not have the corner R shape which is a shape curved along a curve line as viewed from above, and may be substantially right angles as viewed from above.

In the above embodiment, the image forming apparatus of the present disclosure is a serial printer having the carriage 21. However, the present disclosure can also be applied to a line head printer configured to record an image by ejecting inks from a fixed head. Also, the image forming apparatus of the present disclosure can be applied to a complex machine, a copier and the like, in addition to the printer 1.

What is claimed is:

1. An image forming apparatus comprising:
   a main body including a front surface part and a side surface part connected to the front surface part; and
   a cover including a first surface part disposed to face the front surface part and a second surface part connected to the first surface part and disposed to face the side surface part, the cover being attachable to and detachable from the main body,
   wherein the cover includes:
      a first protrusion formed on the first surface part and extending toward the front surface part in a first direction perpendicular to the first surface part; and
      a second protrusion formed on the second surface part and extending toward the side surface part in a second direction perpendicular to the first direction,
   wherein the main body includes:
      an engaging portion formed on the front surface part and engaged with the first protrusion and a groove portion formed along the side surface part,
   wherein the groove portion has an opening that opens closer to the front surface part so that the second protrusion is capable of being inserted into and extracted from the main body in the first direction, and
   wherein the groove portion has a portion which is inclined in a manner that the groove portion is located at a further upper side in a vertical direction as the groove portion becomes closer to the front surface part, the vertical direction being perpendicular to both the first direction and the second direction.

2. The image forming apparatus according to claim 1, wherein a length of the groove portion in the second direction is larger than a length of the second protrusion in the second direction.

3. The image forming apparatus according to claim 1, wherein a tip end portion of the second protrusion in the second direction has an enlarged diameter, and wherein when viewed from the opening in the first direction, the groove portion has a first groove portion formed on an opposite side of a second surface part-side in the second direction and a second groove portion formed on the second surface part-side in the second direction, the tip end portion of the second protrusion capable of being inserted into and extracted from the first groove portion, and only a portion of the second protrusion other than the tip end portion capable of being inserted into and extracted from the second groove portion.

4. The image forming apparatus according to claim 1, wherein the second protrusion is inclined upward or downward.

5. The image forming apparatus according to claim 1, wherein the main body includes a convex portion which is located in the vicinity of a position of the second protrusion inserted in the groove portion in a state where the cover is attached to the main body, the convex portion narrowing a width of the groove portion.

6. The image forming apparatus according to claim 1, wherein the second protrusion has a circular column shape.

7. The image forming apparatus according to claim 1, wherein an upper portion of the main body has a fixing concave portion opened upward, wherein an upper portion of the cover has a through-hole penetrating in the vertical direction, and wherein a fixing member which has passed through the through-hole of the cover attached to the main body is inserted in the fixing concave portion.

8. The image forming apparatus according to claim 1, wherein the second protrusion includes a base end portion having a circular column shape and a tip end portion having a circular columnar shape, a diameter of the circular columnar shape of the tip end portion being larger than a diameter of the circular columnar shape of the base end portion.

9. The image forming apparatus according to claim 8, wherein the groove portion has a first groove portion and a second groove portion, a width of the first groove portion being substantially the same as the diameter of the circular columnar shape of the tip end portion, and a width of the second groove portion being substantially the same as the diameter of the circular columnar shape of the base end portion.

* * * * *